United States Patent
Baier et al.

(10) Patent No.: US 10,514,608 B2
(45) Date of Patent: Dec. 24, 2019

(54) METHOD FOR PRODUCING AN ILLUMINATION SYSTEM FOR AN EUV PROJECTION EXPOSURE SYSTEM, AND ILLUMINATION SYSTEM

(71) Applicant: Carl Zeiss SMT GmbH, Oberkochen (DE)

(72) Inventors: Juergen Baier, Oberkochen (DE); Daniel Runde, Oberkochen (DE); Matthias Manger, Aalen-Unterkochen (DE); Ulrich Mueller, Aalen (DE); Joerg Lichtenthaeler, Aalen (DE); André Orthen, Essingen (DE); Joachim Welker, Heidenheim (DE); Markus Holz, Aalen (DE); Hubert Holderer, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/114,883

(22) Filed: Aug. 28, 2018

(65) Prior Publication Data
US 2018/0373158 A1    Dec. 27, 2018

Related U.S. Application Data

(63) Continuation of application No. PCT/EP2017/053993, filed on Feb. 22, 2017.

(30) Foreign Application Priority Data

Mar. 10, 2016 (DE) .................. 10 2016 203 990

(51) Int. Cl.
*G03B 27/42* (2006.01)
*G03B 27/52* (2006.01)
*G03F 7/20* (2006.01)

(52) U.S. Cl.
CPC .......... *G03F 7/70158* (2013.01); *G03F 7/702* (2013.01); *G03F 7/70033* (2013.01);
(Continued)

(58) Field of Classification Search
CPC ............. G03F 7/70191; G03F 7/70091; G03F 7/70058; G03F 7/702; G03F 7/70075;
(Continued)

(56) References Cited

U.S. PATENT DOCUMENTS 7,473,907 B2    1/2009 Singer et al.
2002/0136351 A1*    9/2002 Singer ................... B82Y 10/00
378/34

(Continued)

FOREIGN PATENT DOCUMENTS

DE    10 2009 033 223 A1    5/2010
DE    10 2012 208 514 A1    11/2013
(Continued)

OTHER PUBLICATIONS

German Office Action, with translation thereof, for corresponding DE Appl No. 10 2016 203 990.3, dated Dec. 5, 2016.
(Continued)

*Primary Examiner* — Mesfin T Asfaw
(74) *Attorney, Agent, or Firm* — Fish & Richardson P.C.

(57) ABSTRACT

The disclosure relates to a method for producing an illumination system for an EUV apparatus in and to an illumination system for an EUV apparatus.

25 Claims, 7 Drawing Sheets

(52) U.S. Cl.
CPC ........ *G03F 7/70075* (2013.01); *G03F 7/7085* (2013.01); *G03F 7/70141* (2013.01)

(58) Field of Classification Search
CPC .... G03F 7/70133; G03F 7/70083; G03F 7/20; G03F 7/70141; G03F 7/70558; G03F 7/70066; G03F 7/70125; G03F 7/70208; G03F 7/70833; H04N 5/2256; H04N 5/2354; H04N 13/254; H04N 1/02815; H04N 5/2357; G02B 21/06; G02B 21/0084; G02B 21/14; G02B 23/2461; G02B 26/02
See application file for complete search history.

(56) References Cited

U.S. PATENT DOCUMENTS

| | | |
|---|---|---|
| 2004/0227915 A1 | 11/2004 | Ohtsuka |
| 2005/0274897 A1* | 12/2005 | Singer ................. G03F 7/70141 250/372 |
| 2006/0098210 A1* | 5/2006 | Freimann ............ G03F 7/70258 356/521 |
| 2009/0097005 A1 | 4/2009 | Suda |
| 2010/0055584 A1 | 3/2010 | Sato et al. |
| 2011/0170078 A1 | 7/2011 | Loopstra et al. |
| 2011/0235015 A1 | 9/2011 | Dengel et al. |

FOREIGN PATENT DOCUMENTS

| | | |
|---|---|---|
| DE | 10 2012 209 412 A1 | 12/2013 |
| WO | WO 2010/008993 A1 | 1/2010 |
| WO | WO 2015/086258 A1 | 6/2015 |

OTHER PUBLICATIONS

International Search Report for corresponding PCT Appl No. PCT/EP2017/053993, dated May 30, 2017.

* cited by examiner

METHOD FOR PRODUCING AN ILLUMINATION SYSTEM FOR AN EUV PROJECTION EXPOSURE SYSTEM, AND ILLUMINATION SYSTEM

CROSS-REFERENCE TO RELATED APPLICATIONS

The present application is a continuation of, and claims benefit under 35 USC 120 to, international application PCT/EP2017/053993, filed Feb. 22, 2017, which claims benefit under 35 USC 119 of German Application No. 10 2016 203 990.3, filed on Mar. 10, 2016. The entire disclosures of these applications are incorporated by reference herein.

FIELD

The disclosure relates to a method for producing an illumination system for an EUV apparatus in and to an illumination system for an EUV apparatus. The EUV apparatus can be, for example, a projection exposure apparatus for EUV microlithography or a mask inspection apparatus, employing EUV radiation, for inspecting masks (reticles) for EUV microlithography.

BACKGROUND

Lithographic projection exposure methods are predominantly used nowadays for producing semiconductor components and other finely structured components, such as, for example, masks for photolithography. In this case, use is made of masks (reticles) or other patterning devices that bear or form the pattern of a structure to be imaged, for example a line pattern of a layer of a semiconductor component. The pattern is positioned in a projection exposure apparatus between an illumination system and a projection lens in the region of the object plane of the projection lens and is illuminated with an illumination radiation shaped by the illumination system. The radiation modified by the pattern travels through the projection lens as projection radiation, said projection lens imaging the pattern with a reduced scale onto the substrate to be exposed. The surface of the substrate is arranged in the image plane of the projection lens optically conjugate to the object plane. The substrate is generally coated with a radiation-sensitive layer (resist, photoresist).

One of the aims in the development of projection exposure apparatuses is to lithographically produce structures having smaller and smaller dimensions on the substrate, for example to obtain greater integration densities in semiconductor components. One approach consists in working with shorter wavelengths of the electromagnetic radiation. By way of example, optical systems have been developed which use electromagnetic radiation from the extreme ultraviolet range (EUV), in particular having operating wavelengths in the range of between 5 nanometers (nm) and 30 nm, in particular of 13.5 nm.

An EUV projection exposure apparatus including an illumination system is known e.g. from U.S. Pat. No. 7,473,907 B2. The illumination system is designed for receiving EUV radiation of an EUV radiation source and for shaping illumination radiation from at least one portion of the received EUV radiation. The illumination radiation is directed into an illumination field in an exit plane of the illumination system during exposure operation, wherein the exit plane of the illumination system and the object plane of the projection lens advantageously coincide. The illumination radiation is characterized by specific illumination parameters and is incident on the pattern within the illumination field with a defined position, shape and size at defined angles. The EUV radiation source, which may be a plasma source, for example, is arranged in a source module separate from the illumination system, said source module generating a secondary radiation source at a source position in an entrance plane of the illumination system.

Arranged in a housing of an illumination system of the type considered here are a plurality of mirror modules, which are each located in the final installed state at installation positions that are provided for the mirror modules. The mirror modules or reflective mirror surfaces of the mirror modules define an illumination beam path extending from the source position to the illumination field. The mirror modules include a first mirror module having a first facet mirror at a first installation position and a second mirror module having a second facet mirror at a second installation position of the illumination system. A mirror module of this type has a main body acting as a carrier, on which facet elements with reflective facets are mounted alone or in groups in accordance with a specific local distribution.

If the reflective facets of the first facet mirror are situated at or near a field plane of the illumination system that is conjugate to the exit plane, the first facet mirror is frequently also referred to as a "field facet mirror." Correspondingly, the second facet mirror is frequently also referred to as a "pupil facet mirror" if the reflective facets thereof are situated at or near a pupil plane which is Fourier-transformed with respect to the exit plane.

The two facet mirrors contribute in the illumination system of the EUV apparatus to the homogenization or mixing of the EUV radiation.

DE 10 2012 209 412 A1 makes note of the fact that, in facet mirrors for EUV applications, the correct angular orientation of the individual facets of each facet mirror is important for the quality of the beam shaping. The emphasis is here on the fact that the individual facets of an individual facet mirror can have different angular orientations relative to one another and that each angular orientation of each facet must be correctly adjusted for the proper function of the facet mirror in the optical system. Therefore it is considered desirable for the angular orientations of the facets to be adjusted with the correct orientation during the production of a facet mirror, which assumes a corresponding precise measurement of the angular orientations of the individual facets. Proposed for this purpose is an optical method for measuring angular orientations of facets of at least one facet mirror of an optical system designed for EUV applications and for subsequently adjusting the angular orientations in dependence on the measured angular orientations. In this method, the facets of the facet mirror are illuminated with measurement light. The measurement light which is reflected by the facets is detected and evaluated to obtain current angular orientations, wherein the angular orientations are subsequently adjusted if the current angular orientations deviate from desired angular orientations. The angular orientations of the facets are obtained in a spectrum of angular orientations of at least ±10° with respect to a reference axis. The method can be performed both on a facet mirror which has been demounted from the illumination system and also on a facet mirror which is mounted at its installation position in the illumination system.

The method permits measurement and setting of angular orientations of facets of the facet mirrors with great precision.

WO 2010/008993 A1 describes illumination systems having facet mirrors, in which the individual facets are tiltable so as to be able to set for example a different illumination setting during the operation of the projection exposure apparatus by tilting individual facets or all facets. Also described therein is a measurement apparatus for permitting measurement of the angular orientations of the tiltable facets during the operation of the projection exposure apparatus. To this end, the measurement apparatus has for each facet mirror a measurement light source and a detector, which is in the form of a Shack-Hartmann sensor.

SUMMARY

The disclosure seeks to specify a method for producing an illumination system, in which it is possible to systematically optimize the mirror positions after installation, with the result that the desired optical performance can be attained within an acceptable time period. The disclosure also seeks to provide an illumination system which can be kept in a well-adjusted state with a reasonable amount of effort.

In one aspect, the disclosure provides a method for producing an illumination system for an EUV apparatus, wherein the illumination system is embodied to receive, during operation of the EUV apparatus, EUV radiation (LR) of an EUV radiation source (LS) at a source position in an entrance plane and to shape, from at least one portion of the received EUV radiation, illumination radiation that is directed into an illumination field in an exit plane (ES) of the illumination system and in the illumination field fulfills an illumination specification. The method has the following steps: installing mirror modules of the illumination system at installation positions provided for the mirror modules to establish an illumination beam path which extends from the source position to the illumination field, wherein the mirror modules include a first mirror module having a first facet mirror at a first installation position and a second mirror module having a second facet mirror at a second installation position of the illumination system; coupling measurement light into the illumination beam path at an input coupling position upstream of a first mirror module of the illumination beam path; detecting measurement light after reflection of the measurement light at each of the mirror modules of the illumination beam path; ascertaining current measurement values for at least one system measurement variable from detected measurement light, wherein the current measurement values represent a current state of the system measurement variable of the illumination system; ascertaining correction values from the current measurement values using sensitivities that represent a relationship between the system measurement variable and a change in the orientation of at least one mirror module in its installation position; and adjusting at least one mirror module with variation of the orientation of the mirror module in the installation position in degrees of freedom of a rigid body using the correction values to change the current state in a manner such that in the case of irradiation with EUV radiation from the EUV radiation source, the illumination radiation in the illumination field fulfills the illumination specification.

In another aspect, the disclosure provides an illumination system for an EUV apparatus, wherein the illumination system is embodied to receive, during operation of the EUV apparatus, EUV radiation (LR) of an EUV radiation source at a source position in an entrance plane and to shape, from at least one portion of the received EUV radiation, illumination radiation that is directed into an illumination field in an exit plane of the illumination system and in the illumination field fulfills an illumination specification. The illumination system includes: a plurality of mirror modules, which are installed at installation positions of the illumination system provided for the mirror modules and define an illumination beam path which extends from the source position to the illumination field. The mirror modules include a first mirror module having a first facet mirror at a first installation position and a second mirror module having a second facet mirror at a second installation position of the illumination system. The illumination system also includes integrated components of a measurement system for measuring measurement values that contain information for determining orientations of the mirror modules in the respective installation positions that are associated with the mirror modules, wherein the measurement system is configured to couple measurement light into the illumination beam path at an input coupling position upstream of a first mirror module of the illumination beam path and to detect it after reflection of the measurement light at each of the mirror modules of the illumination beam path.

It has been recognized that, despite precise manufacturing methods for the components of mirror modules and a carrier structure of an illumination system, mechanical installation tolerances of the mirror modules at their installation positions in the illumination system can be so great that the desired optical performance immediately after installation of the mirror modules is not systematically attainable. By way of example, an installation orientation can deviate from the desired position by up to 1 mm and/or the rotational orientation after installation can deviate from the desired design orientation (desired orientation) by up to 1 mrad.

The disclosure permits targeted adjustment of the orientation of mirror modules at their respective installation position and relative to one another. The possible orientation changes in the adjustment can be performed in the six degrees of freedom (DOF) of a complete mirror module. During the adjustment, a mirror module can thus be moved in three mutually independent directions (translation) and be pivoted about three mutually independent axes (rotation). The orientation of a mirror module can be described e.g. by way of a reference between a module coordinate system and a system coordinate system of the entire illumination system. If the mirror module is a mirror module of a facet mirror, the orientation change can be performed without changing the relative orientations of the facets with respect to the main body. The relative orientations of the facets with respect to the main body or relative to one another should be correctly set temporally before the adjustment considered here, e.g. using the method of DE 10 2012 209 412 A1.

The claimed disclosure provides system measurement technology that permits the targeted adjustment of the entire illumination system and thereby the production of an illumination system which is well adjusted for later use. Used herefor is preferably measurement light from a different wavelength range than EUV radiation which is utilized during proper use of the illumination system. For example, the measurement light can be part of the visible spectral range or the adjoining UV spectral range or IR spectral range, with the result that the measurement and the adjustment can also be performed on an open, non-evacuated illumination system.

During the method, a substantial portion of the illumination beam path is recreated using measurement light. To this end, measurement light is coupled into the illumination beam path at an input coupling position which is situated upstream of a first mirror module of the illumination beam path. The term "first mirror module" here refers to the mirror module that is located optically the closest to the source position or the entrance plane of the illumination system and consequently is first to receive the EUV radiation from the EUV radiation source during operation of the EUV apparatus. The input measurement light is subsequently incident on all mirror modules of the illumination beam path in succession. After reflection of the measurement light at each of the mirror modules of the illumination beam path, the measurement light is detected. The measurement light is consequently coupled in and out at opposite end regions of the illumination beam path. The detected measurement light contains information relating to the orientation of each of the mirror modules which are irradiated in succession.

Current measurement values for at least one system measurement variable are ascertained from the detected measurement light. The current measurement values represent the current state of the respectively considered system measurement variable of the illumination state during the measurement. Using sensitivities that represent a relationship between the respective system measurement variable and a change in the orientation of at least one mirror module in its installation position, correction values are ascertained from the current measurement values. The correction values indicate how the current state must be changed in order to approach the desired state. On the basis of the measurement, the correction values are used to then perform an adjustment of at least one mirror module with variation of the orientation of the mirror module in its installation position, i.e. in its degrees of freedom of a rigid body, in order to change the (measured) current state in a manner such that, with appropriate use, in the case of irradiation with EUV radiation from the EUV radiation source, the illumination radiation in the illumination field fulfills the illumination specification.

The measurement light is coupled in as if a light source were located at the source position. The source beam is imitated in this way. In this case, it is not individual angular orientations or other parameters relevant for the definition of the orientation of a mirror module that are measured, but the state of the radiation after it has passed all the mirrors of the illumination beam path. The quality of the adjustment is consequently determined on the basis of the overall performance of the illumination system and is improved by orientation changes of a mirror module, of a plurality of mirror modules or of all mirror modules to the extent that the illumination radiation is within the illumination specification.

The associated illumination system has one or more integrated components of the measurement system for measuring measurement values which contain information relating to the determination of orientations of the mirror modules in the respective installation positions that are associated with the mirror modules. It is not necessary here for absolute indications relating to the specific definition of an orientation of a mirror module at its installation position to be provided. Rather, it is possible to ascertain on the basis of the measurement instructions as to which mirror module (one or more) should be changed with respect to its orientation and how this should be done in order to make the illumination system fulfill the specification. In other words: It is possible using known relationships to calculate from deviations between measured current measurement values and desired values corrective movements or corrective displacements of the mirror modules (one or more) in order to reduce errors ascertained during the measurement and possibly minimize them. It is assumed here that there is a mathematically describable relationship between deviations of the variables which are observable by way of measurement (i.e. the observables) and the orientation changes of the mirror modules in terms of translation and/or rotation. This is referred to here as "sensitivity." A sensitivity indicates a relationship between the system measurement variable (which is accessible by measurement) and a change in the orientation of at least one mirror module in its installation position.

The adjustment process can be performed relatively quickly and in targeted fashion when meaningful system measurement variables are used which permit unique conclusions as to the orientation changes to be performed on mirror modules.

In accordance with a development, a position of the illumination field in the exit plane of the illumination system is ascertained from the current measurement values. For the ascertainment of the system measurement variable "position of the illumination field," the measurement system can be operated in a "measurement mode for field orientation."

Alternatively, but preferably additionally, in a development, a local distribution of measurement light in a pupil plane, which is Fourier-transformed with respect to the exit plane, of the illumination system is ascertained. For the ascertainment of the system measurement variable "local distribution of measurement light in the pupil plane," the measurement system can be operated in a "measurement mode for telecentricity." The term "telecentricity" here refers to the angle distribution of illumination radiation in the illumination field, determined by way of the local distribution of measurement light in the pupil plane.

This angle distribution is generally dependent on the field point (point in the illumination field) from which the illumination system is measured. The measurement of the system measurement variable "local distribution of measurement light in the pupil plane" can, if desired, be performed for various field regions such that the telecentricity can be determined as a function of field coordinates.

Preferably, a position of a measurement light spot on a facet of the second facet mirror is ascertained as a further system measurement variable from the current measurement values. The associated measurement mode of the measurement system is here also referred to as "spot measurement mode." Using the spot measurement mode, the robustness of the system performance with respect to minor changes after the adjustment can be improved. If it is ascertained in the spot measurement mode that a luminous spot is located close to the periphery of the associated facet of the second facet mirror, this indicates that possibly even a minor orientation change of the second facet mirror could result in the luminous spot missing the associated facet or being only partially incident on the facet. As a result, corresponding radiation portions would be lost during exposure operation. If the spot measurement mode indicates such a critical peripheral location of a luminous spot, it is possible with a corresponding orientation change of one or more of the mirror modules to attempt to arrange the luminous spots on the associated facets of the second facet mirror as centrally as possible on the associated facets, or at any rate far away from the periphery of the facets, so that critical peripheral locations of luminous spots are avoided even in the case of later slight geometry changes within the illumination beam path.

Preferably, all three of the system measurement variables mentioned are determined for an adjustment.

There are various possibilities of determining with sufficient precision the system measurement variables which have been identified as being advantageous. A particularly quick and reliable variant is characterized in that, for the ascertainment of the position of the illumination field, two or more characteristic points (landmarks) at the periphery and/or within the illumination field are defined, a current position of the illumination field is determined on the basis of the current positions of the characteristic points in the exit plane or in a measurement plane that is conjugate to the exit plane, and a desired position of the illumination field is defined on the basis of the desired positions of the characteristic points. In other words, it is not necessary for the entire illumination field to be captured by measurement. Rather, it suffices to observe a suitable selection of characteristic points, to define them with respect to their position, and to use them in determining the correction values.

A targeted adjustment is simplified in that, in an evaluation of the current measurement values, a stipulation relating to a change in orientation of at least one of the mirror modules is derived from a position difference between the current positions and the associated desired positions of the characteristic points. It is thus directly possible to ascertain from the locations of the characteristic points operating instructions for orientation changes on mirror modules.

Analogously, for the ascertainment of the local distribution of measurement light in the pupil plane, which is Fourier-transformed with respect to the exit plane, a multiplicity of characteristic points (landmarks) in the pupil plane can be defined, a current local distribution of the measurement light can be determined on the basis of the current positions of the characteristic points in a measurement plane, which is Fourier-transformed with respect to the exit plane, and a desired local distribution of the measurement light can be defined on the basis of the desired positions of the characteristic points. It is possible in this case as well to derive operating instructions for the steps that are to be performed in the adjustment by deriving, in an evaluation of the current measurement values, a stipulation for a change in the orientation of at least one of the mirror modules from a position difference between the current positions and the associated desired positions of the characteristic points.

A precise performable variant of the spot measurement mode is characterized in that, for the ascertainment of the position of a measurement light spot on a facet of the second facet mirror, a position of the measurement light source is displaced relative to a desired position and an intensity of a measurement light spot is captured as a function of the extent of the displacement. The position dependence of the spot intensity is consequently used as an indicator of the extent of the centering or decentering of a measurement light spot on a facet of the second facet mirror.

Alternatively, it is also possible in the spot measurement mode to capture two images of a facet of the second facet mirror and to evaluate them together. A first image here contains an imaging of the measurement light spot (which illuminates the facet only in a locally limited fashion), and a second image contains an imaging of a completely lit facet of the second facet mirror. From a position-accurate superposition of the first and of the second image, the position of the measurement light spot on the respective facet can be determined.

The method can be used in the original production of the illumination system, i.e. during first production (first installation), to initially adjust the installed mirror modules with respect to their orientation such that the illumination system in the finished mounted state fulfills the illumination specification. To this end, a separate measuring machine may be provided, which contains all the components of the measurement system. These components generally include a measurement light source module, with which measurement light is produced, and a detector module, with which the measurement light, after it has passed through the relevant part of the illumination beam path (reflection at all mirror modules), is detected and prepared for evaluation. The measuring machine can contain a measurement frame, in which the frame of the illumination system can be installed. Using a positioning system, the frame of the illumination system can be moved into the correct position with respect to the measurement light source module and the detector module so that the measurement can be performed.

However, other cases are possible, in which an illumination system of an EUV apparatus at the location of an end user has already been in operation for a prolonged period of time and an adjustment should be performed as part of maintenance works. It is in particular also possible for a mirror module, after prolonged proper use under EUV irradiation, to change in terms of its properties so considerably due to optical, thermal and/or mechanical influences that it needs to be demounted and replaced by a different but not yet defunct mirror module of nominally identical or similar construction. This is also possible within the scope of the claimed disclosure. The wording "producing an illumination system" consequently also includes a restoration, in particular in the case of an end user at the site of earlier use.

Such method variants are characterized by a replacement operation of a mirror module, in which a mirror module is demounted from its installation position, the mirror module is removed from the illumination system, and a mirror module of nominally identical construction is installed in the installation position in place of the removed mirror module. The mirror module of nominally identical construction can be the same mirror module which has been externally newly adjusted and/or repaired, or a different mirror module which has the same optical effect and is structurally identical or similar to the demounted mirror module. The mirror module of nominally identical construction can differ from the demounted mirror module e.g. with respect to some properties, such as material selection, new/other details etc. This exchange (swap operation) should be able to be performed in situ if possible, that is to say at the site of the end user of the EUV apparatus. Even after a mirror module has been replaced, an adjustment would generally be used to bring the illumination system back to specification.

Before the exchange, a reference measurement is preferably performed using the measurement system to document the adjustment state before the start of the swap operation. After the swap operation has finished, the state measured then can be compared to the reference state, e.g. in order to restore the adjustment state from before the swap operation.

If desired, a channel selection can preferably be performed. To this end, different selected ray angles of the input measurement light into the illumination beam path are set successively during the input coupling of measurement light so as to separately measure individual illumination channels. The term illumination channel here refers to a fraction of the entire illumination beam path. An illumination channel extends from the source position via a selected first facet and via a second facet, which is currently associated with said first facet, all the way into a field region, which is lit by the illumination channel, in the exit plane (or a plane which is equivalent thereto).

An illumination system which permits in-situ adjustment of this type is characterized by integrated components of a measurement system for measuring measurement values that contain information for determining orientations of the mirror modules in the respective installation positions that are associated with the mirror modules, wherein the measurement system is configured to couple measurement light into the illumination beam path at an input coupling position upstream of a first mirror module of the illumination beam path and to detect it after reflection of the measurement light at each of the mirror modules of the illumination beam path.

The illumination system is consequently prepared and fabricated for an in-situ measurement, that is to say at the site of use, for example at a semiconductor chip manufacturer.

In accordance with a development, the illumination system includes first interface structures for coupling with a measurement light source module of the measurement system, second interface structures for coupling with a detector module of the measurement system, a switchable input coupling device for coupling measurement light, which has been emitted by the measurement light source module, into the illumination beam path at an input coupling position upstream of a first mirror module of the illumination beam path, and a switchable output coupling device for coupling measurement light out in the direction of a detector module position after reflection at each of the mirror modules of the illumination beam path. The first and second interface structures can be used to secure as desired the possibly transportable modules of the measurement system, such as the measurement light source module and/or the detector module, in the correct position to the body of the illumination system so as to hereby set up the measurement system. The input coupling device and the output coupling device can be used to switch the illumination system between the EUV operation configuration (without input coupling of measurement light) and a measurement configuration (with input and output coupling of measurement light). The switchable devices (input coupling device, output coupling device) can remain in situ at the illumination system, while the measurement light source module and/or the detector module are possibly attached only for the actual measurement and adjustment process and, outside these times, may be used at a different location. Also feasible is that all components of the measurement system remain at the illumination system, which means that any misalignment effects occurring over the lifetime of the illumination system at the end user's location can be readjusted if desired or at specified maintenance intervals without major delays.

The input coupling device in some variants has a plane mirror (input coupling mirror), which can be selectively moved between a neutral position outside the illumination beam path and an input coupling position within the illumination beam path, wherein, in the input coupling position, measurement light of the measurement light source module is coupled into the illumination beam path by way of the plane mirror upstream of a first mirror module and, in the neutral position, the input coupling mirror is situated outside the illumination beam path. The input coupling mirror can be designed e.g. as a folding mirror or as a linearly displaceable mirror.

The output coupling device in some variants has a plane mirror (output coupling mirror), which can be selectively moved between a neutral position outside the illumination beam path and an output coupling position within the illumination beam path, wherein, in the output coupling position, measurement light is coupled out of the illumination beam path by reflection at a last mirror module and, in the neutral position, the output coupling mirror is situated outside the illumination beam path. The output coupling mirror can be designed e.g. as a folding mirror or as a linearly displaceable mirror.

In some embodiments, the measurement light source module is designed such that the beam angle of the measurement light into the illumination beam path can be set as desired, for example to separately measure individual illumination beam channels.

An exemplary embodiment with this function is characterized in that the measurement light source module has a primary measurement light source in an entrance plane, and a 4f imaging system for imaging the primary measurement light source into a secondary measurement light source is connected downstream of the primary measurement light source in an exit plane that is conjugate to the entrance plane, wherein, in a Fourier plane between the entrance plane and the exit plane, a stop which is displaceable transversely to the optical axis of the imaging system and has a through-opening for measurement light is arranged. The stop can act as a channel selection stop for selecting a single measurement channel for a measurement from a multiplicity of possible measurement channels or a corresponding angle of incidence.

The detector module can be designed such that it can be used for all measurement modes and any desired switch between different measurement modes is possible without great effort. The detector module preferably has a field camera and a pupil camera, wherein the field camera can be used to capture an intensity distribution in a field plane of the illumination system and the pupil camera can be used to capture an intensity distribution in a pupil plane of the illumination system. Particularly reliable are variants in which the cameras can be selectively brought into their capturing position by way of a simple displacement of the complete detector module, e.g. by way of a transverse displacement.

BRIEF DESCRIPTION OF THE DRAWINGS

Further advantages and aspects of the disclosure are evident from the claims and from the following description of preferred exemplary embodiments of the disclosure, which are explained below with reference to the figures.

DETAILED DESCRIPTION OF THE EXEMPLARY EMBODIMENTS

Figure 1:
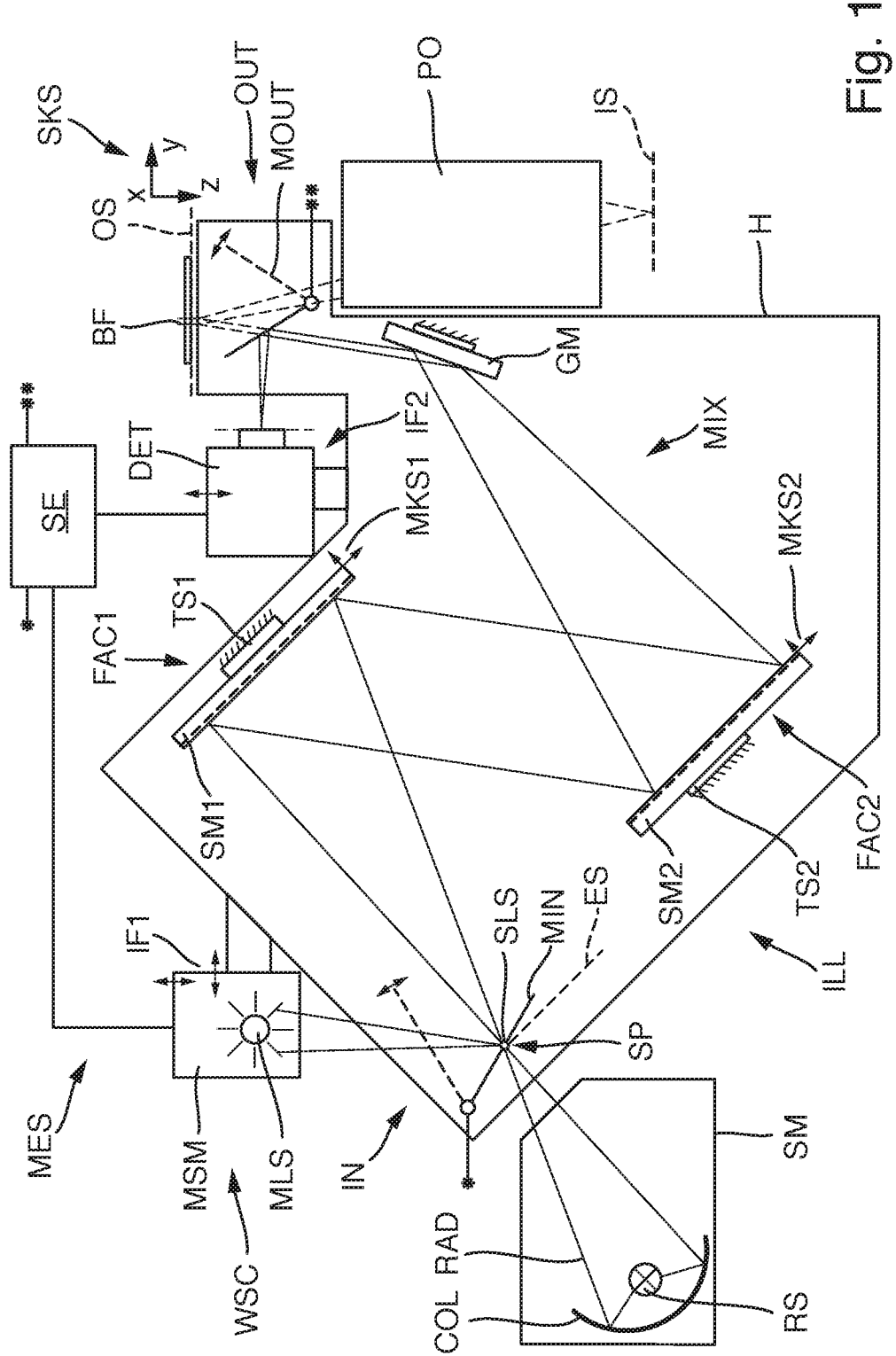
FIG. 1 shows by way of example optical components of an EUV microlithographic projection exposure apparatus in accordance with an embodiment of the disclosure.

FIG. 1 shows by way of example optical components of an EUV microlithographic projection exposure apparatus WSC in accordance with an embodiment of the disclosure. The EUV microlithographic projection exposure apparatus serves during an operation for exposing a radiation-sensitive substrate W, which is arranged in the region of an image plane IS of a projection lens PO, with at least one image of a pattern of a reflective mask (here also alternatively referred to as reticle), said pattern being arranged in the region of an object plane OS of the projection lens. In the case of the example, the substrate is a wafer composed of semiconductor material that is coated with a light-sensitive resist layer.

To facilitate understanding of the description, a Cartesian system coordinate system SKS is indicated, which reveals the respective orientation relationship of the components illustrated in the figures. The projection exposure apparatus WSC is of the scanner type. The x-axis extends perpendicularly to the plane of the drawing in FIG. 1. The y-axis runs toward the right. The z-axis runs downward. The object plane OS and the image plane IS both run parallel to the x-y-plane. During the operation of the projection exposure apparatus, the mask and the substrate are moved synchronously or simultaneously in the y-direction (scanning direction) during a scan operation and are thereby scanned.

The apparatus is operated with the radiation from a primary radiation source RS. An illumination system ILL serves for receiving the radiation from the primary radiation source and for shaping illumination radiation directed onto the pattern. The projection lens PO serves for imaging the pattern onto the light-sensitive substrate.

The primary radiation source RS may be, inter alia, a laser plasma source or a gas discharge source or a synchrotron-based radiation source or a free electron laser (FEL). Such radiation sources generate a radiation RAD in the EUV range, in particular having wavelengths of between 5 nm and 15 nm. The illumination system and the projection lens are constructed with components that are reflective to EUV radiation in order that they can operate in this wavelength range.

The primary radiation source RS is situated in a source module SM, which is separate from the illumination system ILL and also has, inter alia, a collector COL for collecting the primary EUV radiation. The source module SM generates during exposure operation a secondary radiation source SLS at a source position SP in an entrance plane ES of the illumination system ILL. The secondary radiation source SLS is the optical interface between the EUV radiation source or the source module SM and the illumination system ILL.

The illumination system includes a mixing unit MIX and a plane deflection mirror GM (also referred to as G mirror GM), which is operated under grazing incidence. The illumination system shapes the radiation and thereby illuminates an illumination field BF situated in the object plane OS of the projection lens PO or in the vicinity thereof. In this case, the shape and size of the illumination field determine the shape and size of the effectively used object field in the object plane OS. During operation of the apparatus, the reflective reticle is arranged in the region of the object plane OS.

The mixing unit MIX substantially consists of two facet mirrors FAC1, FAC2. The first facet mirror FAC1 is arranged in a plane of the illumination system which is optically conjugate with respect to the object plane OS. Therefore, it is also referred to as a field facet mirror. The second facet mirror FAC2 is arranged in a pupil plane of the illumination system that is optically conjugate with respect to a pupil plane of the projection lens. Therefore, it is also referred to as a pupil facet mirror.

With the aid of the pupil facet mirror FAC2 and the optical assembly disposed downstream in the beam path and including the deflection mirror GM operated with grazing incidence, the individual mirroring facets (individual mirrors) of the first facet mirror FAC1 are imaged into the illumination field.

The spatial (local) illumination intensity distribution at the field facet mirror FAC1 determines the local illumination intensity distribution in the illumination field. The spatial (local) illumination intensity distribution at the pupil facet mirror FAC2 determines the illumination angle intensity distribution in the illumination field OF.

The shape of the illumination field is determined substantially by the shape of the facets of the field facet mirror FAC1, the images of which fall into the exit plane of the illumination system. The illumination field can be a rectangular field or a curved field (ring field).

The beam-guiding region optically between the source position SP and the exit plane (plane of the image field) is the illumination beam path, in which the EUV radiation is successively incident during operation on the first facet mirror FAC1, the second facet mirror FAC2 and the deflection mirror GM.

Figure 2:
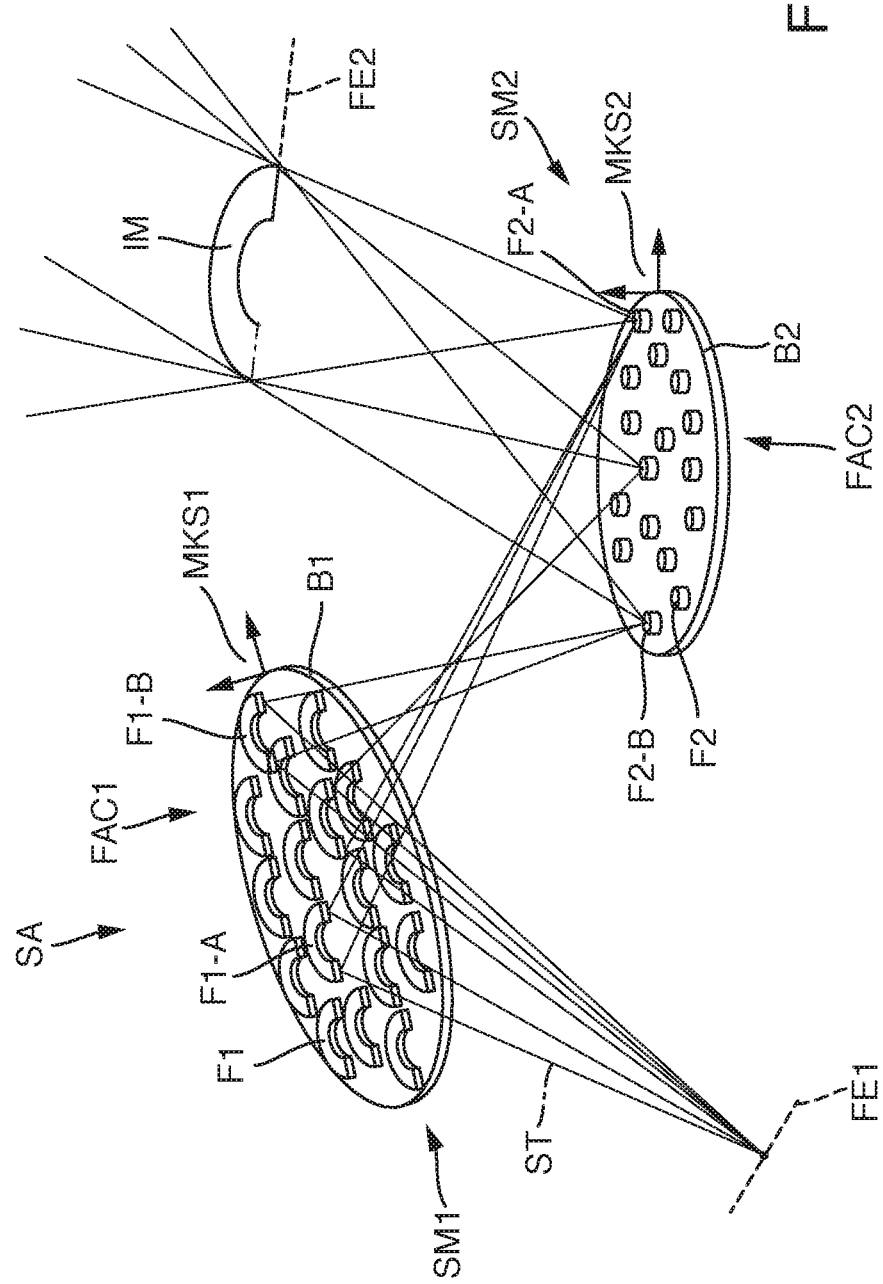
FIG. 2 shows a number of ray trajectories in a mirror arrangement having two facet mirrors.

For further explanation, FIG. 2 schematically illustrates a mirror arrangement SA, having a first facet mirror FAC1 and a second facet mirror FAC2.

The first facet mirror FAC1 has a multiplicity of first facets F1, which are in the form of elongate arcs in the exemplary embodiment shown. This shape of the first facets, however, should be understood to be merely exemplary. Only some of the facets are shown.

The number of first facets in practice is typically significantly higher and can be more than 100 or even more than 300.

The second facet mirror FAC2 has a multiplicity of second facets F2, which are in the form of small dies in the exemplary embodiment shown, which again should be understood to be merely an example.

The first facets F1 are arranged on a first main body B1 of the first facet mirror FAC1. The first main body forms, together with the first facets it carries and any further components, e.g. attachment devices, actuators etc., a first mirror module SM1.

The first mirror module SM1 can be installed in its entirety at the installation position that is provided therefor on an associated first carrier structure TS1 of the illumination system or be demounted again in its entirety and removed. The orientation of the first mirror module SM1 in space, or relative to a reference coordinate system (e.g. the SKS of the housing of the illumination system), can be defined by way of the first module coordinate system MKS1.

The second facets F2 are analogously arranged on a second main body B2 of the second facet mirror, as a result of which a completely installable and replaceable second mirror module SM2 is formed. The orientation of the second mirror module SM2 in space, or relative to a reference coordinate system, can be defined by way of the second module coordinate system MKS2.

The relative orientation or position of a mirror module with respect to the associated carrier structures (frame structure of the illumination system) or to the system coordinate system that is linked thereto can be continuously or incrementally set with great accuracy in six degrees of freedom. Suitable adjustment mechanisms are provided herefor, which can also be referred to as tilt manipulators. A tilt manipulator can include e.g. two set screws and a joint or three set screws which can have their movement direction perpendicular to a virtual mirror plane. However, a motor-driven mechanism may also be provided (e.g. a motor-driven set screw or a hydraulic set cylinder), which can also be used in a closed vacuum chamber. An incremental adjustment of the orientation by way of interchangeable spacers is likewise possible. The elements for orientation setting can be situated between the frame structure (carrier structure) of the illumination system and suitable interface points of a mirror module. Separate orientation sensors may be provided for capturing the installation orientation of a mirror module at its installation site. An orientation sensor can operate e.g. electrically, electromagnetically or optically. By way of example, three distance sensors (e.g. capacitive, interferometric or laser sensors) can be mounted to the frame structure and adjusted. Located at the associated mirror module can be corresponding counter-surfaces (targets), which are either adjusted very precisely with respect to the mirror module or have a position with respect to the module coordinate system which is very precisely known.

Drawn in FIG. 2 by way of example are a few rays ST illustrating the EUV illumination beam path when the mirror arrangement is installed in an optical system and in operation. The rays ST start here from a first field plane FE1 (intermediate focus), and are then reflected by the facets F1 of the first facet mirror FAC1 onto the facets F2 of the second facet mirror FAC2. The rays are directed by the facets F2 of the second facet mirror FAC2 into a second field plane FE2, corresponding to the exit plane of the illumination system. Images IM of the facets of the first facet mirror FAC1 are thereby produced in the second field plane FE2, wherein, in more precise terms, the images of all first facets F1 are produced in the field plane FE2 by mutual superposition. The superposed images IM together form the lit illumination field BF.

Between the facets F1 of the first facet mirror FAC1 and the facets F2 of the second facet mirror FAC2 there is a unique correspondence. That means that each facet F1 of the first facet mirror FAC1 is assigned a specific facet F2 of the second facet mirror FAC2. In FIG. 2, this is shown for a facet F1-A and a facet F1-B of the first facet mirror FAC1 and a facet F2-A and a facet F2-B of the second facet mirror FAC2. In other words, the rays ST that are reflected by the facet F1-A are incident exactly on the facet F2-A, and the used light rays that are reflected by the facet F1-B are incident on the facet F2-B etc. In this case, there is a one-to-one correspondence between the facets F1 of the first facet mirror FAC1 and the facets F2 of the second facet mirror FAC2.

In deviation from a one-to-one correspondence between the facets F1 and F2, it is also possible, however, that each facet F1 is assigned more than one facet of the facets F2. This is the case if the facets F1 are tiltable, that is to say can assume various tilted states, with the result that, in a first tilted state, each facet F1 is assigned a specific facet of the second facets F2, and, accordingly, in a different tilted state, is assigned a different facet of the second facets F2. Generally possible is a one-to-n correspondence (n being a natural number) between the first facets F1 and the second facets F2, depending on how many states the first facets F1 can assume.

The illumination beam path is composed of many individual illumination channels, wherein an illumination channel extends in each case from the source position or from the intermediate focus FE1, via a first facet F1 and a second facet F2 that is currently assigned to the first facet, into the illumination field.

In the exemplary embodiment shown of the mirror arrangement, the first facet mirror FAC1 is conjugate to the field plane FE2 and is therefore also referred to as a field facet mirror. In comparison, the second facet mirror FAC2 is conjugate to a pupil plane and is therefore also referred to as a pupil facet mirror.

In the case that the mirror arrangement is used in an illumination system of a projection exposure apparatus, the field plane FE2 is the plane in which the reticle is arranged, the pattern of which is intended to be imaged onto a wafer. In the case that the mirror arrangement SA is used in a mask inspection apparatus, the field plane FE2 is the plane in which the mask to be inspected is arranged.

In the exemplary embodiment of FIG. 1, the illumination system includes, in addition to a mirror arrangement having two facet mirrors FAC1 and FAC2, which acts as a mixing unit MIX, also the field-shaping mirror FFM, which is operated under grazing incidence and is situated between the second facet mirror FAC2 and the exit plane or the object plane of the projection lens. This additional mirror can be favorable for reasons of installation space. In other exemplary embodiments, the illumination system has, aside from the two facet mirrors FAC1 and FAC2, no further mirrors in the illumination beam path.

In the illumination system ILL from FIG. 1, all three mirror modules, i.e. the first field facet mirror FAC1, the second field facet mirror FAC2 and the deflection mirror GM, are in each case replaceable in their entirety. That is to say, after releasing corresponding attachment devices, they can be removed from their respective installation positions and be replaced by other components, for example components which are nominally of the same construction, without completely disassembling the illumination system. This has been instituted, inter alia, because it may be possible for the mirror properties to degrade after prolonged irradiation with high-energy EUV radiation to the point where the intended overall performance of the illumination system can no longer be ensured. Replacement of a mirror module may be appropriate for other reasons as well, for example if, in a facet mirror having facets which are resettable by way of actuators, facet resetting fails.

The replacement of a mirror module should be able to be performed within a short period of time and, after the mirror exchange, the illumination system should once again fulfill its desired function. In particular, the position of the illumination field in the exit plane should be situated sufficiently close to its desired position and the radiation should again be incident on the illumination field with the same angle distribution at a given illumination setting as before the mirror exchange.

Since it is nevertheless not possible, despite narrow manufacturing tolerances, to ensure that the optical performance of the illumination system after replacement of a mirror module systematically corresponds again to the desired performance before the mirror exchange, auxiliary devices are provided in the illumination system of the exemplary embodiment that permit the systematic optimization of the mirror positions after installation such that the desired optical performance can be achieved within an acceptable time period. Said devices make possible a targeted adjustment of the illumination system at the site of its use, that is to say for example at the place of manufacture of semiconductor chips.

For this reason, inter alia, the illumination system is equipped with components of a measurement system IVIES which permits optical acquisition of information for determining the orientations of the mirror modules in the respective installation positions that are associated with the mirror modules, with the result that the adjustment can be systematically made on the basis of the measurement values which are obtained by the measurement system. The measurement system MES of the exemplary embodiment has the following components.

A measurement light source module MSM includes a measurement light source MLS for emitting measurement light from the visible spectral range. The measurement light source used can be, for example, a light-emitting diode (LED) or a laser diode. The measurement light source module MSM is arranged at the housing H of the illumination system outside the evacuable interior by way of first interface structures IF1, can be mounted for measurement purposes and, if needed, removed again and may be used for measurement purposes at a different location, as desired. The position of the measurement light source module with respect to the housing can be changed using positioning drives in terms of multiple axes and both parallel to the central radiation direction and perpendicular thereto. An exemplary embodiment of a measurement light source module will be explained in more detail in connection with FIG. 3.

A switchable input coupling device IN is provided for coupling measurement light emitted by the measurement light source module MSM into the illumination beam path at an input coupling position upstream of the first facet mirror FAC1. The input coupling device includes a plane mirror, which serves as the input coupling mirror MIN and which can be panned between a neutral position (illustrated in dashed lines) outside the illumination beam path and the input coupling position (illustrated in solid lines) using an electric drive. In the case of the example, the measurement light source module produces an image of the measurement light source MLS at the site of the source position SP (intermediate focus of the EUV radiation). The input coupling mirror MIN can be panned such that the measurement light beam is coupled into the illumination beam path at the site of the source position SP as if the measurement light source MLS were located at the site of the source position SP. With this arrangement, it is thus possible to imitate or reproduce the source beam present in EUV operation by way of measurement light.

Situated behind the last mirror module of the illumination beam path, that is to say in the example of FIG. 1 behind the deflection mirror GM, in the region between the deflection mirror GM and the exit plane of the illumination system (object plane OS of the projection lens), is a switchable output coupling device OUT for coupling measurement light out of the illumination beam path, wherein the measurement light is coupled out after the measurement light has been reflected at each of the mirror modules of the illumination beam path. The switchable output coupling device includes a plane mirror, which is used as the output coupling mirror MOUT and which can be panned between the neutral position (illustrated in dashed lines) outside the illumination beam path and the output coupling state (illustrated in solid lines) using an electric drive. In the output coupling state, the output coupling mirror reflects the measurement light coming from the deflection mirror GM in the direction of a detector module position, in which a detector module DET is arranged.

The detector module DET is attached to the outside of the housing H of the illumination system in its detector position using second interface structures IF2 and can be reset in terms of its position via electrically actuable positioning drives. An exemplary embodiment will be explained in more detail in connection with FIG. 4.

All controllable components of the measurement system MES are connected in signal-transmitting fashion to the control unit SE of the measurement system in the ready-for-operation installed state of the measurement system. Also situated in the control unit is an evaluation unit for evaluating the measurement values obtained using the measurement light, which measurement values represent the adjustment state of the mirror modules within the illumination system.

Figure 3:
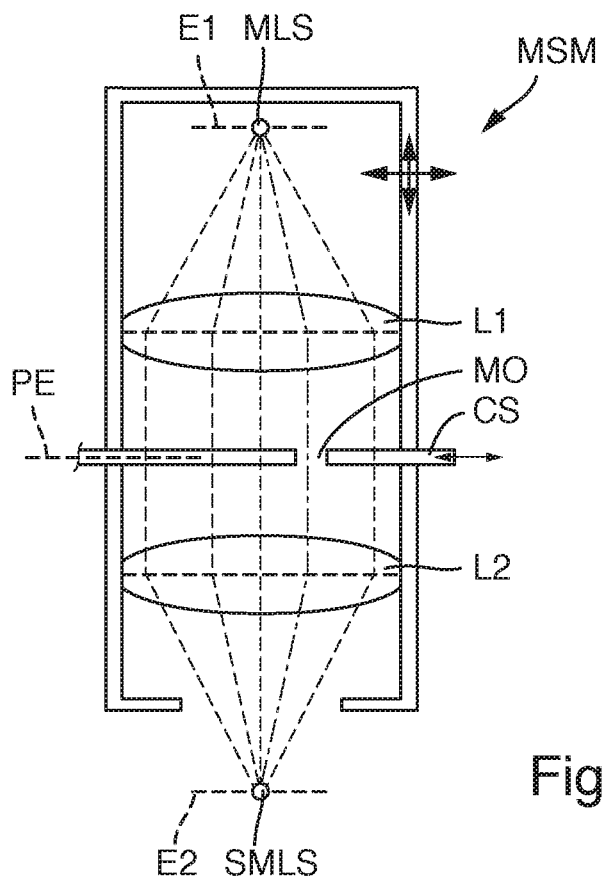
FIG. 3 shows an exemplary embodiment of a measurement light source module.

On the basis of FIG. 3, an exemplary embodiment of a measurement light source module MSM is explained in more detail, which can be used for example in the measurement system from FIG. 1. A primary measurement light source MLS, for example in the form of an LED, is arranged in an entrance plane E1. Arranged within the housing are lens elements L1, L2 of a 4f imaging system, with which an image of the primary measurement light source MLS, that is to say a secondary measurement light source SMLS, is produced in an exit plane E2, which is optically conjugate to the entrance plane E1. Situated between the entrance plane and the exit plane is a pupil plane PE, which is a plane that is Fourier-transformed with respect to the entrance plane and exit plane. Located in the region of the pupil plane PE is a stop CS having an aperture MO, through which a selected portion of the measurement light can pass. The position of the aperture MO is freely selectable in two dimensions within the pupil plane. The displaceable stop CS can thus be used to select a specific portion of the measurement light for emission. The site of the through-opening in the pupil plane here determines the angle of incidence of the measurement light, which was allowed to pass, at the site of the secondary measurement light source SMLS and consequently also the beam angle of the measurement light from the measurement light source module. In this way, various individual channels or channel groups of the illumination system can be selected for a measurement.

Figure 4:
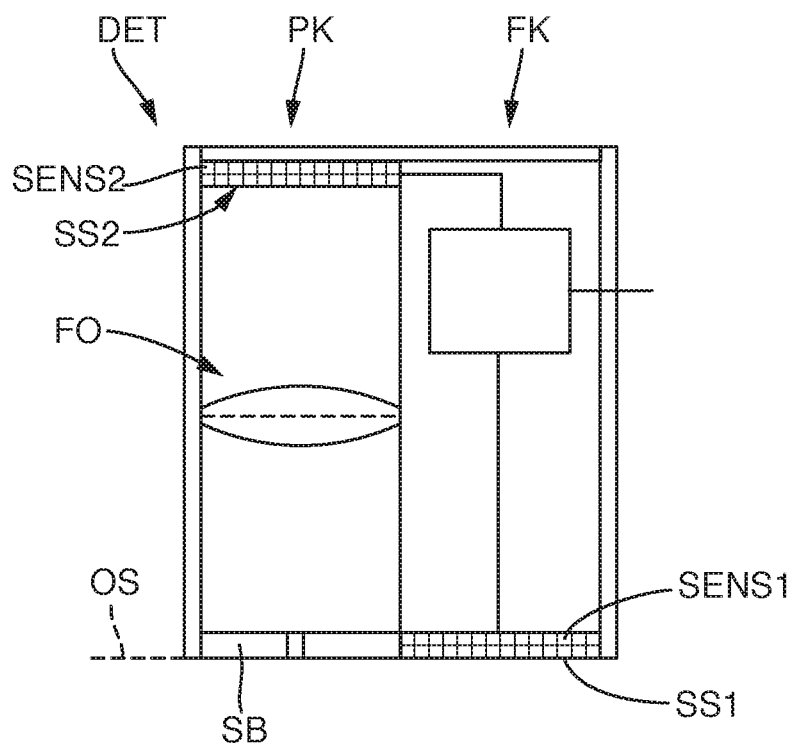
FIG. 4 shows an exemplary embodiment of a detector module.

On the basis of FIG. 4, an exemplary embodiment of a detector module DET is explained, which can be used as a detector module in the exemplary embodiment of FIG. 1. The detector module is here arranged such that a first sensor surface SS1 is arranged in a position that is optically conjugate to a field plane of the illumination system. In the case of the mirror arrangement of FIG. 2, this plane would correspond, for example, to the second field plane FE2, in the case of FIG. 1 to the exit plane of the illumination system that coincides with the object plane OS. A first sensor SENS1, with which measurement light intensities can be captured with high spatial resolution, is arranged such that its light-sensitive sensor surface is located in the first sensor plane SS1. The first sensor can include, for example, a CCD sensor which is sensitive to the wavelength spectrum of the measurement light. For example, a two-dimensional CCD array sensor can be used, as is also used in video cameras or digital cameras. The first sensor SENS1 can be used to measure the intensity distribution in a field plane of the illumination system.

The function of the first sensor could be realized by way of a reticle that is equipped with light-sensitive sensors, which reticle is moved to the position of the reticle (which is used during operation).

The detector module includes a second sensor SENS2, which is likewise a spatially resolving sensor that is sensitive to measurement light, in the form of a CCD array sensor. The second sensor is provided for capturing the illumination intensity distribution in a pupil plane of the illumination system with corresponding positioning of the detector module. For this purpose, a Fourier optical unit FO is connected upstream of the second sensor SENS2, with the result that the second sensor surface SS2 is situated in a plane which is Fourier-transformed with respect to the first sensor surface SS1. The measurement light coming from the illumination system is guided via a slit stop SB in the first plane SS1 through the Fourier optical unit FO to the second sensor SENS2. By displacing the detector module parallel to the first plane SS1, the field camera FK, which is equipped with the first sensor SENS1, or the pupil camera PK, which is equipped with the second sensor SENS2, can be selectively used for the measurement.

It should be assumed that the mechanical installation tolerances of the mirror modules into the illumination system are generally too large to ensure the desired optical performance of the illumination system immediately after installation of the mirror modules at the installation positions which are each provided therefor without further adjustment effort. A mirror module can in this case be misaligned with respect to its desired orientation in all six degrees of freedom of a rigid body. The misalignment can be mathematically described by deviations of the respective mirror coordinate system MKS1, MKS2 etc. with respect to the system coordinate system SKS. The surface-mounted position can deviate from the desired design orientation for example up to the order of magnitude of 1 mm with respect to the translation in the x-, y- and z-directions and/or up to the order of magnitude of 1 mrad with respect to a rotation around said respective axes.

In the following text, adjustment methods will be described which permit the optimization of the mirror position (orientation of a mirror module in its installation position) after installation, such that the desired optical performance of the entire illumination system can be reliably achieved. In many method variants, the measurement system is used to capture three system measurement variables or performance measurement variables, specifically (i) the position of the illumination field at the reticle level or in the exit plane of the illumination system (corresponding to the object plane OS of the projection lens),
(ii) the local distribution of measurement light in a pupil plane of the illumination system that is Fourier-transformed with respect to the exit plane, said local distribution determining the telecentricity at the reticle level or in the exit plane, and
(iii) a luminous spot deviation on pupil facets, i.e. the position of a measurement light spot on a facet of the second facet mirror FAC2.

The measurement mode for determining the position of the illumination field is also referred to below as the "measurement mode for the field orientation." The measurement mode with which the local distribution of measurement light in the pupil plane is determined will also be referred to below as the "measurement mode for telecentricity." The measurement mode for determining the luminous spot deviation on pupil facets is also referred to below as the "spot measurement mode."

Figure 5:
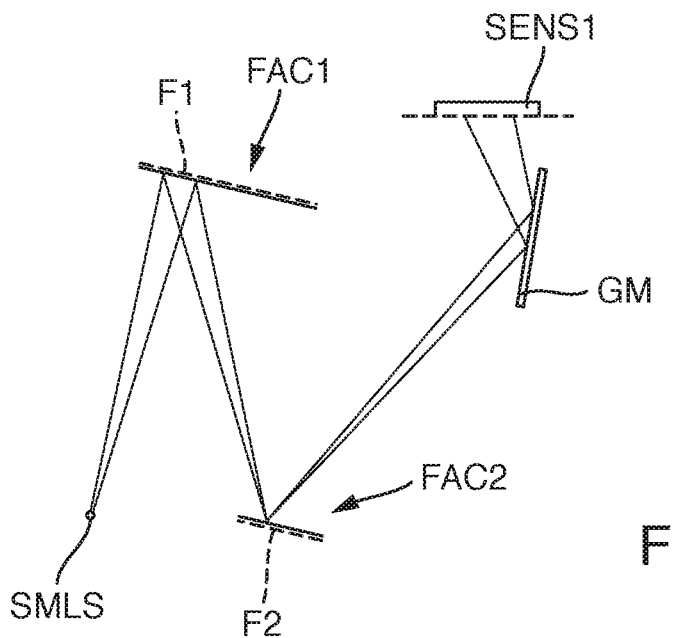
FIG. 5 schematically illustrates a beam path in a measurement mode for field orientation.

To ascertain the orientation of the illumination field at the reticle level (measurement mode for field orientation), the detector module DET is laterally displaced such that the radiation which is reflected by the output coupling mirror MOUT in the direction of the detector module is incident on the first sensor SENS1. A corresponding measurement light beam path is schematically illustrated in FIG. 5. A measurement light beam coming from the secondary measurement light source SMLS is first incident on the first facet mirror FAC1, is reflected thereby in the direction of an associated second facet F2 of the second facet mirror FAC2, and is guided hereby via the G mirror GM onto the first sensor SENS1, where an image of the corresponding first facet F1 is produced.

Figure 6:
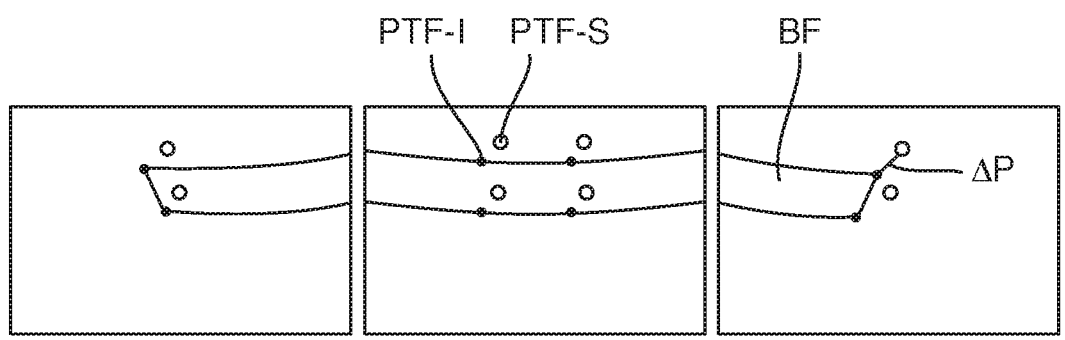
FIG. 6 shows characteristic points of an illumination field.

FIG. 6 shows an illustration, composed of three partial images, of an illumination field BF during the measurement. For quantitatively ascertaining the position of the illumination field, a number of characteristic points PTF-I along the periphery of the illumination field are defined. In the case of the example, a characteristic point PTF-I is located in each of the four corners of the illumination field. A plurality of characteristic points are defined with regular and irregular distances along the edges connecting the corners. The characteristic points PTF-I are selected such that it is possible by way of their position in the illustrated drawing plane to calculate the position of the illumination field with sufficient accuracy. The sought desired state, which corresponds to the desired performance of the illumination system, is defined by corresponding characteristic points PTF-S, which together indicate the desired orientation of the illumination field in the exit plane. In the evaluation of the current measurement values, a stipulation for a change in orientation of at least one of the mirror modules is derived from a position difference ΔP between the current positions PTF-I and the associated desired positions PTF-S. If a mirror module is changed in terms of its orientation in accordance with this stipulation, the current position of the illumination field approaches the sought desired position, ideally up to the coincidence of all orientations of the current positions with the desired positions.

Figure 7:
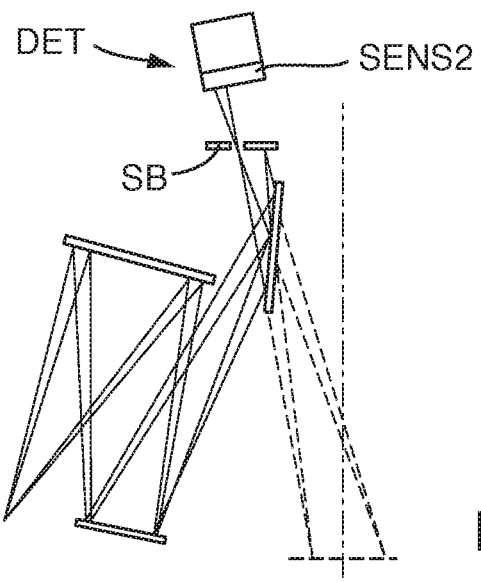
FIG. 7 schematically illustrates a beam path in a measurement mode for telecentricity.
Figure 8:
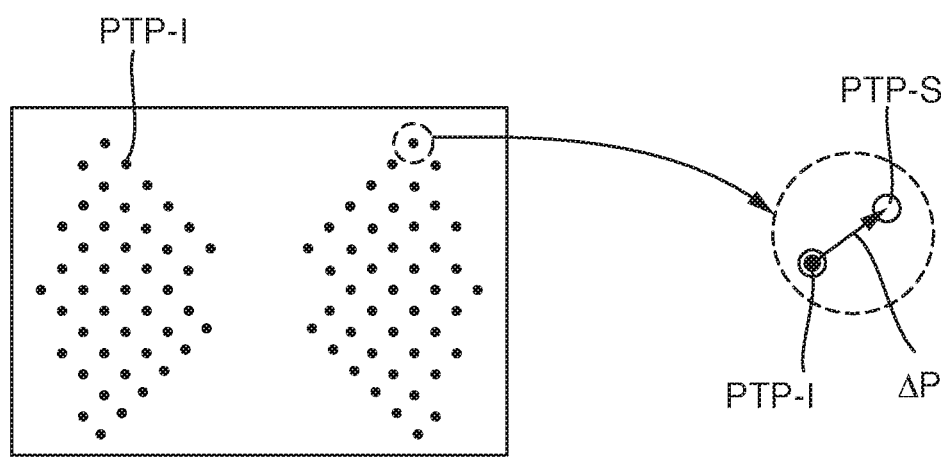
FIG. 8 shows local distributions of measurement light spots in a pupil plane of the illumination system in a measurement mode for telecentricity.

For the measurement in the measurement mode for telecentricity, the measurement system is rearranged on the detector side by laterally displacing the detector module DET in a manner such that measurement light passes through the slit stop SB into the pupil camera having a Fourier optical unit and can be captured by the second sensor SENS2. A corresponding schematic beam path is shown in FIG. 7. The pupil camera here records a virtual image of the second facet mirror FAC2 or of the illumination intensity distribution on said facet mirror. In a measurement mode in which a plurality of illumination channels are captured simultaneously, a plurality of first facets, or all first facets, on the first facet mirror FAC1 are illuminated such that a number of channels, with that number corresponding to the number of the illuminated first facets, contribute to the illumination of the illumination field. Situated in this case on each facet F2 of the second facet mirror (pupil facet mirror) should be a luminous spot, the image of which on the second sensor SENS2 represents the current position PTP-I in a measurement plane which is Fourier-transformed with respect to the exit plane. FIG. 8 shows a possible distribution of measurement light spots in the region of the pupil facet mirror FAC2. The light spot distribution shown corresponds to a set dipole illumination with two diametrically opposite illumination poles. Analogously to the measurement of the field orientation, to each current position PTP-I belongs a desired position PTP-S, which represents the desired location of the corresponding measurement spot. The entirety of the desired positions then represents the desired local distribution of measurement light in the pupil plane, in which the facets of the second facet mirror are located. In the evaluation of the current measurement values, stipulations for a change in the orientation of at least one mirror module are derived from the position differences ΔP between the current positions and the associated desired positions of the characteristic points, which specifications indicate how the orientation of the mirror module must be changed to attain a smaller deviation between the current positions and the desired positions.

The illustrated measurement represents the local distribution of measurement light in the pupil plane as viewed from the field region in which the through-opening of the slit stop is located. By displacing the slit stop to a different position of the illumination field, the local distribution in the pupil for a different field region can be captured. As a result, a field-dependent measurement of the local distribution of measurement light in the pupil plane is possible.

It is possible that, during the adjustment of the orientations of the mirror modules, a constellation is set in which the measurement light spots on one or more second facets (facets of the pupil mirror FAC2) are situated just about in their entirety on the reflective surface of the associated facets, but very close to the periphery of the facet. In this case, if the overall geometry should change slightly at a later point, the associated measurement light spot will then no longer be situated in its entirety on the pupil facet or miss the pupil facet completely. The corresponding illumination light portion would then be lost for the process, as a result of which the performance overall would be worse.

Figure 9A:
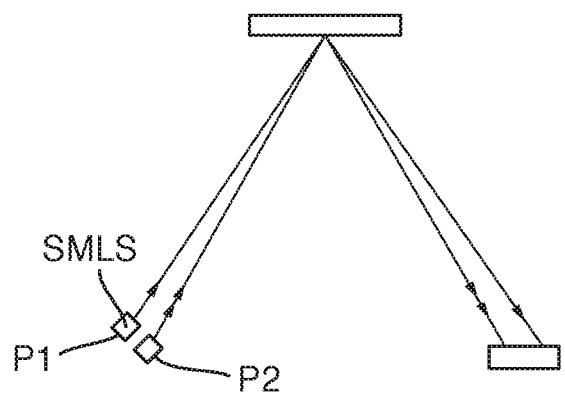
FIGS. 9A and 9B show a schematic beam path in 9A and a diagram of the position dependence of the spot intensity in a spot measurement mode in 9B.
Figure 9B:
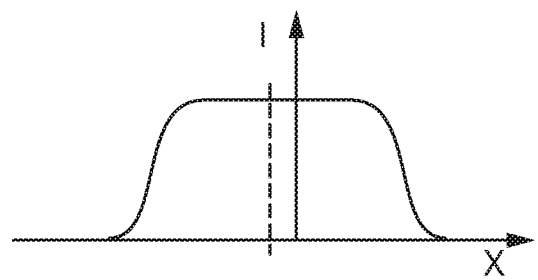

In order to improve the robustness of the overall system against small geometry changes and in particular to avoid that small geometry changes result in a situation in which pupil facets are no longer sufficiently impinged, the measurement system is additionally preferably operated in a third measurement mode (spot measurement mode) for adjustment purposes. Corresponding measurement light beam paths for the measurement mode for the spot deviation are illustrated schematically in FIGS. 9A and 9B. The detector module DET here has the configuration in which a virtual image of the pupil plane is captured with the second sensor SENS2, that is to say the same configuration as in the measurement mode for telecentricity. For the measurement, the measurement light source module MSM is laterally displaced, such that the position of the secondary measurement light source is displaced from a first position P1 to a second position P2. Measured simultaneously with the displacement is the intensity I of a measurement light spot as a function of the displacement in the x-direction (transverse direction). FIG. 9B shows a corresponding diagram of the dependence of the intensity I of the measurement light spot as a function of the lateral displacement Δx. As long as the measurement light spot during the displacement of the measurement light source is still situated in its entirety on the corresponding pupil facet F2, the intensity does not change and corresponds to the intensity at the entirely centric location of the measurement light spot. As soon as a portion of the measurement light spot crosses the periphery of the facet and is no longer reflected, the intensity decreases, with less and less light being reflected with further decentering of the measurement light spot, possibly until the intensity falls to zero, when the measurement light spot completely misses the pupil facet. The adjustment can be performed such that, within the framework of the possibilities, taking into account the other system measurement variables, the measurement light spots on the second pupil facets are situated as close as possible to the centers thereof, such that minor misalignments at a later point in time do not result in a decrease of performance.

Figure 10A:
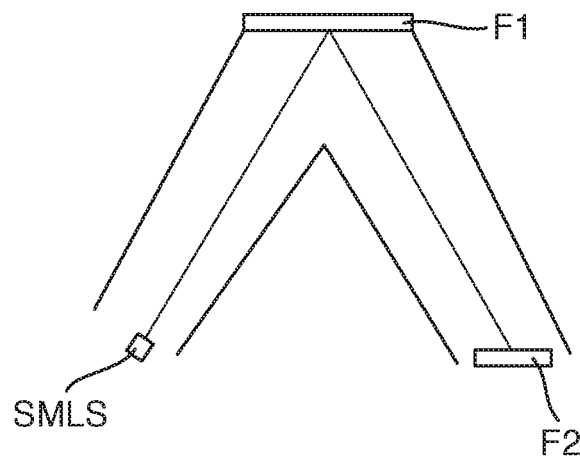
FIGS. 10A and 10B schematically illustrates a different variant of the spot measurement mode.
Figure 10B:
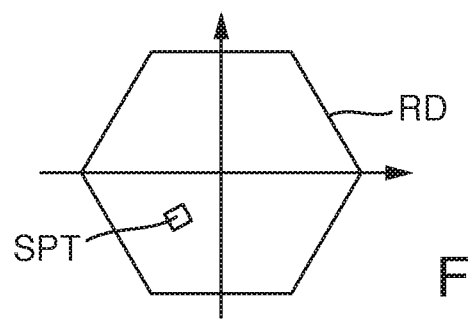

FIGS. 10A and 10B schematically illustrate a different variant of the spot measurement mode. Here, two two-dimensional images of the region of the second facet F2 are captured and superposed. In a first measurement phase, a first image is captured which contains the quasi-dot-shaped measurement light spot SPT on the second facet (pupil facet). The measurement light spot SPT approximately corresponds to the secondary measurement light source SMLS in terms of shape and size. The second facet does not have to be (completely) discernible on the first image. For the recording of the second image, in a second measurement phase, the radiation coming from the secondary measurement light source SMLS is distributed via a diffusing screen or the like, such that the pupil facet is irradiated such that the entire facet surface is lit and the periphery RD or the outer contour of the facet is discernible in the second image as a light-dark transition. The (computational) superposition of the images is illustrated in FIG. 10B. The position of the measurement light spot SPT on the pupil facet and the lateral distance from the periphery RD of the facet are able to be derived from the superposed image by way of image processing.

Various possibilities for using the method and the measurement system exist. In one variant, all components of the measurement system, in particular the components which are mounted outside the housing H, such as the measurement light source module MSM and the detector module DET, remain at the illumination system. In this way, permanent monitoring of the illumination system or checking at regular time intervals of the adjustment/misalignment is possible. Any misalignment effects occurring over the lifetime can hereby be caught in time directly in situ and possibly be corrected. This can result in relaxations of the specification for the overall system with respect to lifetime effects. It is also possible for the removable external components (in particular the measurement light source module MSM and the detector module DET) to be mounted to the corresponding interfaces of the illumination system only for adjustment purposes, to perform the adjustment, and, after the adjustment has been made, to remove the components again and possibly use them at a different location.

Figure 11:
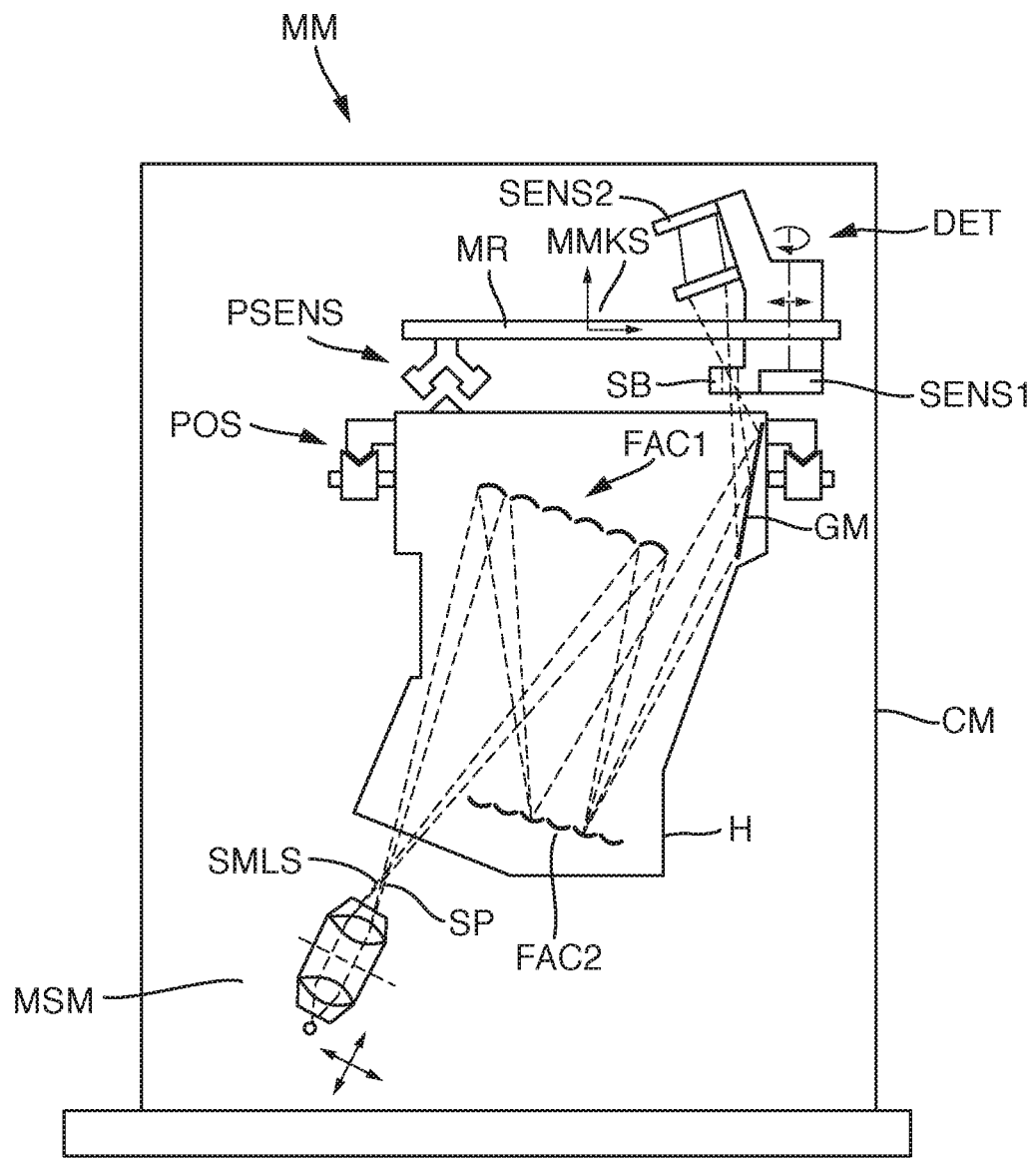
FIG. 11 shows an exemplary embodiment of a measuring machine for carrying out the method.

The method can also be used in the original production of the illumination system, i.e. during first production, to initially adjust the installed mirror modules with respect to their orientation such that the illumination system in the finished mounted state fulfills the illumination specification. For illustrative purposes, FIG. 11 shows an exemplary embodiment of a measuring machine MM, which has a dark chamber CM formed by a light-proof housing, in which all optical components of the measurement system MES are arranged. The interior is dimensioned such that a completely installed illumination system ILL fits inside. The installed components of the measurement system MES include a fixedly installed measurement light source module MSM, with which measurement light is produced, and a likewise fixedly installed detector module DET, with which the measurement light, after it has passed through the complete illumination beam path (reflection at all mirror modules), is detected and prepared for evaluation. The two modules are mounted to a measurement frame MR such that their positions with respect to the machine coordinate system MMKS can be accurately determined. The measurement light source module is biaxially displaceable (see double-headed arrows). The detector module can be pivoted or panned about a module axis which extends perpendicularly to the exit plane of the illumination system and can be linearly displaced perpendicularly to said module axis. The measurement frame also carries elements of a positioning system POS, with which the complete illumination system ILL within the measuring machine can be brought into a defined position with respect to the measurement light source module MSM and the detector module DET. The position is monitored using position sensors PSENS.

After position-accurate installation of the illumination system, the measurement can be performed similarly to as it has been described. In contrast to the variant which is able to be performed by the end user, no input coupling device and no output coupling device are used here at the illumination system. The measurement light beam is radiated in via the identical openings and emitted on the exit side like the EUV radiation during productive operation.

In the examples which have been illustrated by depictions, the reflective facets of the first facet mirror are situated at or optically near a field plane of the illumination system that is conjugate to the exit plane, which is why the first facet mirror is also referred to as a "field facet mirror." The second facet mirror is here referred to as a "pupil facet mirror," because the reflective facets thereof are situated at or near a pupil plane which is Fourier transformed with respect to the exit plane. These positions of the mirror modules are not mandatory. At least one of the mirror modules can also be arranged at a greater optical distance from a field plane and a pupil plane, and then it could be described neither as a field facet mirror nor as a pupil facet mirror.

What is claimed is:

1. A method for producing an illumination system for an EUV apparatus, the illumination system being configured so that, during operation of the EUV apparatus, the illumination system receives EUV radiation of an EUV radiation source at a source position in an entrance plane and shapes, from a portion of the received EUV radiation, illumination radiation that is directed into an illumination field in an exit plane of the illumination system, the illumination field fulfilling an illumination specification, the method comprising:

installing mirror modules of the illumination system at installation positions provided for the mirror modules to establish an illumination beam path which extends from the source position to the illumination field, the mirror modules comprising a first mirror module comprising a first facet mirror at a first installation position and a second mirror module comprising a second facet mirror at a second installation position of the illumination system;

coupling measurement light into the illumination beam path at an input coupling position upstream the mirror module that is first along the illumination beam path;

detecting measurement light after reflection of the measurement light at each of the mirror modules of the illumination beam path;

ascertaining current measurement values for at least one system measurement variable from detected measurement light, the current measurement values representing a current state of the system measurement variable of the illumination system;

ascertaining correction values from the current measurement values using sensitivities that represent a relationship between the system measurement variable and a change in the orientation of at least one mirror module in its installation position; and adjusting at least one mirror module with variation of the orientation of the mirror module in the installation position in degrees of freedom of a rigid body using the correction values to change the current state in a manner such that in the case of irradiation with EUV radiation from the EUV radiation source, the illumination radiation in the illumination field fulfills the illumination specification, wherein the method further comprises:
demounting the first mirror module from its installation position;
removing the first mirror module from the illumination system;
installing a third mirror module in place of the first mirror module into the installation position; and
adjusting the third mirror module by changing an orientation of the mirror module in the installation position in degrees of freedom of a rigid body.

2. The method of claim 1, further comprising using measurement light from a different wavelength range than the EUV radiation used during use of the illumination system, wherein the wavelength range of the measurement light is selected from the group consisting of a visible spectral range, an adjoining UV spectral range, and an IR spectral range.

3. The method of claim 2, wherein further comprising ascertaining, from the current measurement values, a system measurement variable selected from the group consisting of:
(i) a position of the illumination field in the exit plane;
(ii) a local distribution of measurement light in a pupil plane, which is Fourier-transformed with respect to the exit plane, of the illumination system; and
(iii) a position of a measurement light spot on a facet of the second facet mirror.

4. The method of claim 3, further comprising:
for the ascertaining the position of the illumination field, defining at least two characteristic points at the periphery and/or within the illumination field;
determining a current position of the illumination field on the basis of the current positions of the characteristic points in a plane selected from the group consisting of the exit plane and a measurement plane that is conjugate to the exit plane; and
defining a desired position of the illumination field on the basis of the desired positions of the characteristic points.

5. The method of claim 4, further comprising, in an evaluation of the current measurement values, deriving a stipulation for a change in the orientation of at least one of the mirror modules from a position difference between the current positions and the associated desired positions of the characteristic points.

6. The method of claim 3, further comprising:
for ascertaining the local distribution of measurement light in the pupil plane which is Fourier-transformed with respect to the exit plane, defining a multiplicity of characteristic points in the pupil plane;
determining a current local distribution of the measurement light on the basis of the current positions of the characteristic points in a measurement plane which is Fourier-transformed with respect to the exit plane; and
defining a desired local distribution of the measurement light on the basis of the desired positions of the characteristic points.

7. The method of claim 6, further comprising, in an evaluation of the current measurement values, deriving a stipulation for a change in the orientation of at least one of the mirror modules from a position difference between the current positions and the associated desired positions of the characteristic points.

8. The method of claim 3, further comprising:
for ascertaining the position of a measurement light spot on a facet of the second facet mirror, displacing a position of the measurement light source relative to a desired position; and capturing an intensity of a measurement light spot as a function of the extent of the displacement.

9. The method of claim 1, further comprising:
before demounting the first mirror module, performing a reference measurement using the measurement system in order to capture a reference state that represents the adjustment state before the start of the swap operation; and
after adjusting the third mirror module, measuring the adjustment state measured compared to the reference state to restore the adjustment state from before the swap operation.

10. The method of claim 2, further comprising setting selected ray angles of the input measurement light into the illumination beam path during the input-coupling of measurement light separately measure individual illumination channels.

11. The method of claim 1, wherein the first mirror module is upstream of the second mirror module along the illumination beam path.

12. The method of claim 1, further comprising modifying the first mirror module to provide the third mirror module.

13. An illumination system for an EUV apparatus, the illumination system being configured so that, during operation of the EUV apparatus, the illumination system receives EUV radiation of an EUV radiation source at a source position in an entrance plane and shapes, from at least one portion of the received EUV radiation, illumination radiation that is directed into an illumination field in an exit plane of the illumination system, the illumination field fulfilling an illumination specification, the illumination system comprising:
a plurality of mirror modules installed at installation positions of the illumination system provided for the mirror modules and configured to define an illumination beam path which extends from the source position to the illumination field, the mirror modules comprising a first mirror module comprising a first facet mirror at a first installation position and a second mirror module comprising a second facet mirror at a second installation position of the illumination system; and
integrated components of a measurement system configured to measure measurement values containing information to determine orientations of the mirror modules in the respective installation positions associated with the mirror modules,
wherein:
the measurement system is configured to couple measurement light into the illumination beam path at an input coupling position upstream of the mirror module that is first in the illumination beam path;
measurement system is configured to detect the measurement light after reflection of the measurement light at each of the mirror modules in the illumination beam path;
the illumination system is configured so that:
the first mirror is removable from the illumination system;
a third mirror module is installable in place of the first mirror module into the installation position; and
the third mirror module is adjustable by changing an orientation of the mirror module in the installation position in degrees of freedom of a rigid body.

14. The illumination system of claim 13, further comprising:

first interface structures to couple with a measurement light source module (MSM) of the measurement system (MES);
second interface structures to couple with a detector module (DET) of the measurement system (MES);
a switchable input coupling device to couple measurement light, which has been emitted by the measurement light source module (MSM), into the illumination beam path at an input coupling position upstream of the mirror module that is first in the illumination beam path; and
a switchable output coupling device to couple measurement light out in the direction of a detector module position after reflection at each of the mirror modules of the illumination beam path.

15. The illumination system of claim 13, wherein:
the input coupling device comprises a plane mirror selectively movable between a neutral position outside the illumination beam path and an input coupling position within the illumination beam path, in the input coupling position, measurement light of the measurement light source module is coupled into the illumination beam path via the plane mirror upstream of the mirror module that is first in the beam path, and, in the neutral position, the plane mirror is situated outside the illumination beam path; and/or
the output coupling device comprises a plane mirror selectively movable between a neutral position outside the illumination beam path and an output coupling position within the illumination beam path, wherein, in the output coupling position, measurement light is coupled out of the illumination beam path after reflection at the mirror module that is last in the illumination beam path, and, in the neutral position, the plane mirror is situated outside the illumination beam path.

16. The illumination system of claim 14, wherein the measurement light source module is configured so that different beam angles of the measurement light into the illumination beam path are settable.

17. The illumination system of claim 14, wherein:
the measurement light source module comprises a primary measurement light source (MLS) in an entrance plane;
the measurement light source module comprises a 4f imaging system configured to image the primary measurement light source into a secondary measurement light source connected downstream of the primary measurement light source in an exit plane that is conjugate to the entrance plane;
in a Fourier plane between the entrance plane and the exit plane, a stop is displaceable transverse to the optical axis of the imaging system; and
the stop has a through-opening for measurement light.

18. The illumination system of claim 14, wherein:
the detector module comprises a field camera and a pupil camera;
the field camera is usable to capture an intensity distribution in a field plane of the illumination system; and
the pupil camera is usable to capture an intensity distribution in a pupil plane of the illumination system.

19. The illumination system of claim 13, wherein the third mirror module is a modified form of the first mirror module.

20. A method, comprising:
installing mirror modules of an EUV illumination system at installation positions provided for the mirror modules to establish an illumination beam path which extends from an EUV source position to an illumination field of the EUV illumination system, the mirror modules comprising a first mirror module comprising a first facet mirror at a first installation position and a second mirror module comprising a second facet mirror at a second installation position of the illumination system;

detecting measurement light after reflection of the measurement light at each of the mirror modules of the illumination beam path;

ascertaining current measurement values for at least one system measurement variable from detected measurement light, the current measurement values representing a current state of the system measurement variable of the illumination system;

ascertaining correction values from the current measurement values using sensitivities that represent a relationship between the system measurement variable and a change in the orientation of at least one mirror module in its installation position; and adjusting at least one mirror module with variation of the orientation of the mirror module in the installation position in degrees of freedom of a rigid body using the correction values to change the current state in a manner such that in the case of irradiation with EUV radiation from the EUV radiation source, the illumination radiation in the illumination field fulfills the illumination specification, wherein the method further comprises:
removing the first mirror module from the illumination system; and
installing a third mirror module in place of the first mirror module into the installation position.

21. The method of claim 20, further comprising adjusting the third mirror module by changing an orientation of the mirror module in the installation position in degrees of freedom of a rigid body.

22. The method of claim 20, further comprising modifying the first mirror module to provide the third mirror module.

23. The method of claim 1, wherein:
the at least one mirror module comprises a main body supporting at least one reflective optical element; and
adjusting the at least one mirror module comprises adjusting the main body with variation of the orientation of the main body in the installation position in degrees of freedom of a rigid body using the correction values to change the current state in a manner such that in the case of irradiation with EUV radiation from the EUV radiation source, the illumination radiation in the illumination field fulfills the illumination specification.

24. The illumination system of claim 13, wherein the third mirror module comprises a main body supporting at least one reflective element, and the main body is adjustable by changing an orientation of the mirror module in the installation position in degrees of freedom of a rigid body.

25. The method of claim 20, wherein:
the at least one mirror module comprises a main body supporting at least one reflective optical element; and
adjusting the at least one mirror module comprises adjusting the main body with variation of the orientation of the main body in the installation position in degrees of freedom of a rigid body using the correction values to change the current state in a manner such that in the case of irradiation with EUV radiation from the EUV radiation source, the illumination radiation in the illumination field fulfills the illumination specification.

* * * * *